United States Patent [19]
Noro

[11] Patent Number: 4,739,280
[45] Date of Patent: Apr. 19, 1988

[54] AMPLIFIER CIRCUIT HAVING REDUCED CROSSOVER DISTORTION

[75] Inventor: Masao Noro, Hamamatsu, Japan

[73] Assignee: Nippon Gakki Seizo Kabushiki Kaisha, Japan

[21] Appl. No.: 48,047

[22] Filed: May 11, 1987

[30] Foreign Application Priority Data

May 21, 1986 [JP] Japan ................................ 61-116841

[51] Int. Cl.$^4$ ............................................. H03F 1/32
[52] U.S. Cl. ..................... 330/149; 330/100; 330/151
[58] Field of Search ................. 330/84, 98, 99, 100, 330/149, 151, 260, 293, 268, 274

[56] References Cited

FOREIGN PATENT DOCUMENTS

66110  5/1980  Japan ................................. 330/151

*Primary Examiner*—James B. Mullins
*Attorney, Agent, or Firm*—Darby & Darby

[57] ABSTRACT

An amplifier circuit including two general purpose operational amplifiers is disclosed. The output terminals of first and second operational amplifiers are connected via first and second resistors in series. A connection point between the first and second resistors is connected to an output terminal and is also connected to an inverting input terminal of the first operational amplifier via a feedback loop. Thus, the first and second operational amplifiers work as class-A amplifier, so that the crossover distortion is prevented from being generated. An input signal is inputted to a non-inverting input terminal of the first operational amplifier wherein the input signal is amplified. The amplified input signal is added with a dc bias voltage and is supplied to a non-inverting input terminal of the second operational amplifier. The output voltage of the first operational amplifier varies in a positive voltage area, and the output voltage of the second operational amplifier varies in a negative voltage area. Thus, an output signal of which distortion factor is relatively small is produced at the output terminal.

5 Claims, 1 Drawing Sheet

AMPLIFIER CIRCUIT HAVING REDUCED CROSSOVER DISTORTION

BACKGROUND OF THE INVENTION

1. Field of the Invention

The present invention generally relates to amplifier circuits, and more particularly to an amplifier circuit which includes two operational amplifiers and in which a distortion factor thereof is relatively small.

2. Prior Art

Conventionally, the current at the output stage of the general purpose operational amplifier is set so that the output stage operates in class-B mode, resulting that the crossover distortion must be inevitably generated.

It is impossible to perfectly remove the above crossover distortion by employing the NFB (negative feedback). Hence, the general purpose operational amplifier can not be applied to an audio circuit which requires low-distortion characteristics. The operational amplifiers for specific use of the audio circuits have been produced and sold, however, the price thereof is not extremely high.

SUMMARY OF THE INVENTION

It is accordingly a primary object of the present invention to provide an amplifier circuit in which an output signal without the crossover distortion can be obtained by use of general purpose operational amplifiers of which price is relatively low.

According to one aspect of the invention, there is provided an amplifier circuit comprising: (a) a first operational amplifier for amplifying an input signal, the input signal being inputted into a non-inverting input terminal of the first operational amplifier wherein the input signal is amplified and the amplified input signal is outputted as a first output signal; (b) dc bias means for adding a dc bias voltage to the first output signal so as to produce a dc biased signal; (c) a second operational amplifier for amplifying the dc biased signal, the dc biased signal being inputted into a non-inverting input terminal of the second operational amplifier wherein the dc biased signal is amplified and the amplified dc biased signal is outputted as a second output signal; (d) output means for outputting a third output signal, the output means comprising of first and second resistors which are connected in series, the output means being connected between output terminals of the first and second operational amplifiers, the third output signal being obtained at a connection point of the first and second resistors and being outputted to an output terminal; and (e) a feedback loop for feeding back the third output signal to an inverting input terminal of the first operational amplifier.

BRIEF DESCRIPTION OF THE DRAWINGS

Further objects and advantages of the present invention will be apparent from the following description, reference being had to the accompanying drawings wherein preferred embodiments of the present invention are clearly shown.

In the drawings.

DESCRIPTION OF THE PREFERRED EMBODIMENTS OF THE INVENTION

Figure 1:
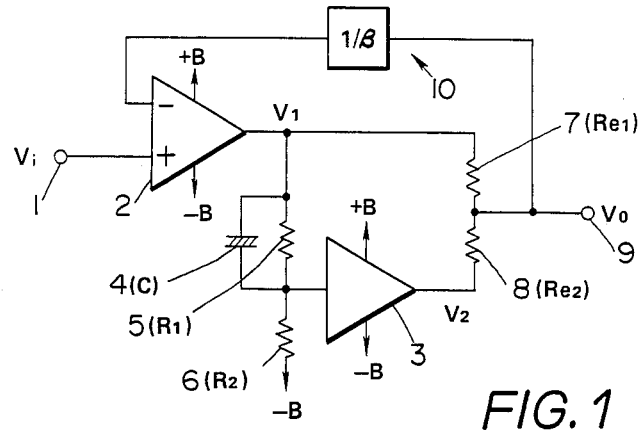
FIG.1 is a circuit diagram showing a first embodiment of the present invention.
Figure 3:
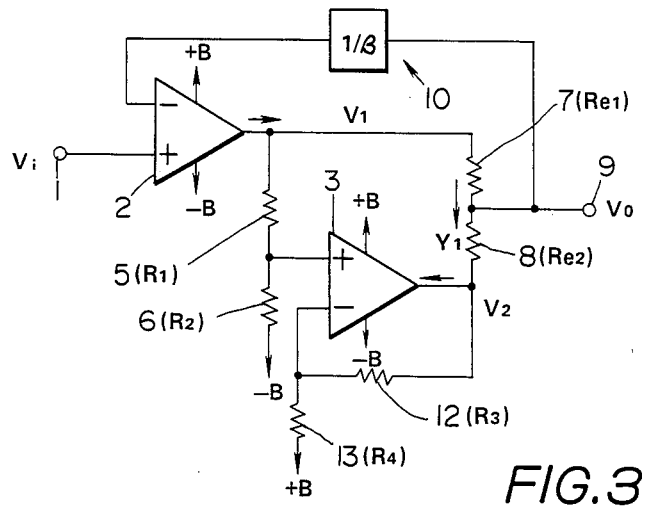
FIG. 3 is a circuit diagram showing a second embodiment of the present invention.

Referring now to the drawings, wherein like reference characters designate like or corresponding parts between FIG. 1 and FIG. 3, FIG. 1 shows a circuit diagram of a first embodiment of the present invention. In FIG. 1, 1 designates an input terminal, 2 and 3 respectively designate general purpose operational amplifiers. For instance, dual operational amplifiers μA1458 produced by FAIRCHILD are applied as the operational amplifiers 2 and 3. In addition, the operational amplifier 3 is constituted as a voltage follower of which gain equals to "1". 4 designates a capacitor having capacity C which takes out an ac component from an output signal of the operational amplifier 2. The ac component is supplied to an input terminal of the operational amplifier 3. 5 to 8 designate resistors having respective resistances $R_1$, $R_2$, $R_{e1}$ and $R_{e2}$. Furthermore, 9 designates an output terminal and 10 designates a feedback loop. The feedback loop 10 has a feedback ratio of $1/\beta$, and the output signal at the output terminal 9 is fed back to an inverting input terminal of the operational amplifier 2 via the feedback loop 10 wherein the output signal is amplified by $1/\beta$.

In the above constitution, $V_i$ denotes the input voltage at the input terminal 1, $V_o$ denotes the output voltage at the output terminal 9, $V_1$ denotes the output voltage of the operational amplifier 2, $V_2$ denotes the output voltage of the operational amplifier 3 and $\pm B$ denote the voltages of the power source. By using these symbols, the following formula (1) can be obtained.

$$(V_1 \cdot R_2 + V_2 \cdot R_{e1})/R_{e1} + R_{e2}) = V_0 = \beta \cdot V_i \quad (1)$$

When the value of the input impedance of the operational amplifier 3 is set to ∞ (infinity), the formula (1) can be changed into the following formula (2).

$$V_2 = (R_2 \cdot V_1 - R_1 \cdot B)/(R_1 + R_2) \quad (2)$$

When no input signal is inputted, i.e., $V_i = 0$, the above formula (1) can be changed into the following formula (3).

$$V_1 \cdot R_{e2} = -V_2 \cdot R_{e1} \quad (3)$$

From the above formulas (2) and (3), the output voltages of the operational amplifiers 2 and 3 can be presented as shown in the following formulas (4) and (5).

$$V_1 = (R_{e1}/R_{e2}) \cdot R_1 \cdot B/[R_1 + R_2 + R_2 \cdot (R_{e1}/R_{e2})] > 0 \quad (4)$$

$$V_2 = -R_1 \cdot B/[R_1 + R_2 + R_2 \cdot (R_{e1}/R_{e2})] < 0 \quad (5)$$

Therefore, when no input signal is inputted, the output voltage $V_1$ of the operational amplifier 2 becomes the positive constant voltage as described in the formula (4), and similarly, the output voltage $V_2$ of the operational amplifier 3 becomes the negative constant voltage as described in the formula (5). In other words, the output terminal of the operational amplifier 2 is subjected to positive bias, and the output terminal of the operational amplifier 3 is subjected to negative bias. For instance, when $R_{e1}$ is set equal to $R_{e2}$, the bias voltages of the operational amplifiers 2 and 3 can be expressed as the following formula (6).

$$\pm R_1 \cdot B/(R_1 + 2R_2) \quad (6)$$

In the above described condition, when the ac input voltage $V_i$ is inputted to the input terminal 1, the output voltage $V_o$ at the output terminal 9 can be expressed as the following formula (7).

$$V_o = \beta \cdot V_i \quad (7)$$

Figure 2:
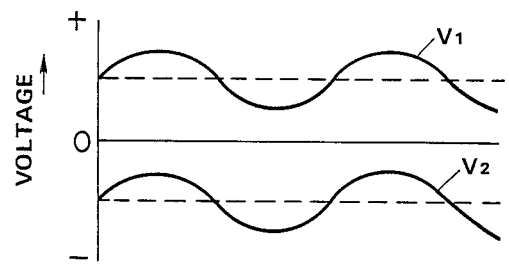
FIG. 2 shows waveforms for explaining operation of the first embodiment shown in FIG. 1.

In this case, since the output terminal of the operational amplifier 2 is subjected to positive bias, the waveform of the output voltage $V_1$ of the operational amplifier 2 becomes as shown in FIG. 2 wherein the variable range of the value of the output voltage $V_1$ lies in the positive voltage area. Next, when the frequency f of the input voltage $V_i$ can be expressed as $f > 1/(2\pi R_1 C)$, only the ac component of the output voltage $V_1$ of the operational amplifier 2 is passed through the capacitor 4 and is supplied to the operational amplifier 3 wherein the output voltage $V_1$ is amplified by gain "1" and is outputted as the output voltage $V_2$. Since the output terminal of the operational amplifier 3 is subjected to negative bias, the waveform of the output voltage $V_2$ becomes as shown in FIG. 2 wherein the variable range of the value of the output voltage $V_2$ lies in the negative voltage area. The above output voltages $V_1$ and $V_2$ are added together by use of the resistors 7 and 8 and are outputted from the output terminal 9 as the output voltage $V_o$.

Thus, the value of the output voltage $V_1$ of the operational amplifier 2 varies in the positive voltage area only, and the value of the output voltage $V_2$ of the operational amplifier 3 varies in the negative voltage area only. In other words, the output stage of the operational amplifiers 2 and 3 works as class-A amplifier. As a result, the crossover distortion will not be generated at output terminals of the operational amplifiers 2 and 3, hence, the distortion level in the output voltage $V_o$ can be reduced to the relatively low level.

The input impedance of the circuit shown in FIG. 1 equals to the input impedance of the operational amplifier 2, hence, the input characteristics thereof will not be deteriorated. In addition, the range in which the output stage of the operational amplifiers 2 and 3 work as class-A amplifier is identical to the range in which the peak-to-peak value of the output voltage $V_o$ does not exceed the double of the output voltage $V_1$ or $V_2$ described in the former formula (4) or (5).

Next, description will be given with respect to the second embodiment of the invention in conjunction with FIG. 3. The differences between the circuit shown in FIG. 1 and the circuit shown in FIG. 3 can be expressed as follows.

(1) The capacitor 4 shown in FIG. 1 is not provided in FIG. 3.

(2) A resistor 12 (resistance $R_3$) is inserted between the inverting input terminal and the output terminal of the operational amplifier 3, and a resistor 13 (resistance $R_4$) is inserted between the inverting input terminal of the operational amplifier 3 and the terminal of the positive power source (+B). Thus, the operational amplifier 3 is not constituted as the voltage follower but as a non-inverting amplifier.

Next, description will be given with respect to the operation of the second embodiment. As same as the formula (1) described before, the following formula (8) concerning FIG. 3 can be obtained.

$$(V_1 \cdot R_{e2} + V_2 \cdot R_{e1})/(R_{e1} + R_{e2}) = V_o = \beta \cdot V_i \quad (8)$$

In this case, voltages at both of input terminals of the operational amplifier 3 are equal to each other, hence, the following formula (9) can be obtained.

$$(R_2 \cdot V_1 - R_1 \cdot B)/(R_1 + R_2) = (R_4 \cdot V_2 + R_3 \cdot B)/R_3 + R_4 \quad (9)$$

When the resistances of the resistors 5, 6, 12 and 13 are set as $R_1 = R_3$ and $R_2 = R_4$, the formula (9) can be changed into the following formula (10).

$$V_1 - V_2 = 2 \cdot (R_1/R_2) \cdot B \quad (10)$$

The following formulas (11) and (12) can be obtained by use of the formulas (10) and (8).

$$V_1 - V_o = 2 \cdot [R_{e1}/(R_{r1} + R_{e2})] \cdot (R_1/R_2) \cdot B \quad (11)$$

$$V_o - V_2 = 2 \cdot [R_{e2}/(R_{e1} + R_{e2})] \cdot (R_1/R_2) \cdot B \quad (12)$$

The above voltage $V_1 - V_o$ designates a voltage across the resistor 7, and similarly, the above voltage $V_o - V_2$ designates a voltage across the resistor 8. Hence, $(V_1 - V_o)/R_{e1}$ designates a current flowing the resistor 7, and similarly, $(V_o - V_2)/R_{e2}$ designates a current flowing the resistor 8. Both of values of the above currents can be described as the following formula (13).

$$[2/(R_{e1} + R_{e2})] \cdot (R_1/R_2) \cdot B \quad (13)$$

In short, a constant current flows in a direction shown by an arrow $Y_1$, regardless of the value of the input voltage $V_i$. This means that the constant current is always flowing from the output terminal of the operational amplifier 2 and is always flowing into the output terminal of the operational amplifier 3. Thus, the operational amplifiers 2 and 3 work as the class-A amplifier. As a result, it is possible to realize an amplifier circuit with low distortion factor by use of general purpose operational amplifiers of which price are relatively low.

The present invention may be practiced or embodied in still other ways without departing from the spirit or essential character thereof. And, the preferred embodiments described herein are illustrative and not restrictive, the scope of the invention being indicated by the appended claims and all variations which come within the meaning of the claims are intended to be embraced therein.

What is claimed is:

1. An amplifier circuit comprising:
  (a) a first operational amplifier for amplifying an input signal, said input signal being inputted into a non-inverting input terminal of said first operational amplifier wherein said input signal is amplified and the amplified input signal is outputted as a first output signal;
  (b) dc bias means for adding a dc bias voltage to said first output signal so as to produce a dc biased signal;
  (c) a second operational amplifier for amplifying said dc biased signal, said dc biased signal being inputted into a non-inverting input terminal of said second operational amplifier wherein said dc biased signal is amplified and the amplified dc biased signal is outputted as a second output signal;
  (d) output means for outputting a third output signal, said output means comprising of first and second resistors which are connected in series, said output means being connected between output terminals of said first and second operational amplifiers, said third output signal being obtained at a connection point of said first and second resistors and being outputted to an output terminal; and (e) a feedback loop for feeding back said third output signal to an inverting input terminal of said first operational amplifier.

2. An amplifier circuit according to claim 1, wherein a gain of said second operational amplifier equals to "1" and said second operational amplifier works as a voltage follower.

3. An amplifier circuit according to claim 1, wherein said dc bias means comprises of third and forth resistors which are connected in series, a source power being supplied to one terminal of said dc bias means while another terminal of said dc bias means is connected to the output terminal of said first operational amplifier, and a connection point between said third and forth resistors being connected to the noninverting input terminal of said second operational amplifier.

4. An amplifier circuit according to claim 3, wherein said dc bias means further comprises of a capacitor, said capacitor being connected between the output terminal of said first operational amplifier and the connection point between said third and forth resistors.

5. An amplifier circuit according to claim 3 further includes fifth and sixth resistors, one terminal of said fifth resistor being connected to the output terminal of said second operational amplifier while another terminal of said fifth resistor is connected to one terminal of said sixth resistor and an inverting input terminal of said second operational amplifier, and a source power being supplied to another terminal of said sixth resistor so that said second operational amplifier works as a non-inverting amplifier.

* * * * *